United States Patent
Martens et al.

[11] Patent Number: 5,821,690
[45] Date of Patent: Oct. 13, 1998

[54] ELECTROLUMINESCENT DEVICES HAVING A LIGHT-EMITTING LAYER

[75] Inventors: Josef Herbert Ferdinand Martens, Stuttgart, Germany; Paul Leslie Burn, Oxford, United Kingdom; Karl Pichler, Cambridge, United Kingdom; Richard Henry Friend, Cambridge, United Kingdom; Andrew Bruce Holmes, Cambridge, United Kingdom

[73] Assignee: Cambridge Display Technology Limited, Cambridge, United Kingdom

[21] Appl. No.: 604,966

[22] PCT Filed: Aug. 23, 1994

[86] PCT No.: PCT/GB94/01840

§ 371 Date: Apr. 22, 1996

§ 102(e) Date: Apr. 22, 1996

[87] PCT Pub. No.: WO95/06400

PCT Pub. Date: Mar. 2, 1995

[30] Foreign Application Priority Data

Aug. 26, 1993 [GB] United Kingdom ............ 9317932

[51] Int. Cl.$^6$ .................. H01J 1/62; H01J 63/04
[52] U.S. Cl. .................. 313/506; 313/504; 313/507
[58] Field of Search ...................... 313/504, 506, 313/503, 505, 509, 498, 507; 345/4, 79, 76; 257/40

[56] References Cited

U.S. PATENT DOCUMENTS 4,908,603  3/1990  Yamaue et al. ............ 313/506
5,247,190  9/1993  Friend et al. ............ 313/504
5,399,502  3/1995  Friend et al. .
5,514,878  5/1996  Holmes et al. ............ 313/504

OTHER PUBLICATIONS

Applied Physics Letters., vol. 61, No. 26, 28 Dec. 1992, New York US pp. 3092–3094 D. Braun et al. 'Nanosecond ransient electroluminescence from polymer light–emitting diodes' see the whole document.

Thin Solid Films, vol. 216, No. 1, 28 Aug. 1992, Lausanne CH pp. 96–98, D. Braun and A.J. Heeger, 'Electroluminescence from light–emitting diodes fabricated from conducting polymers' see whole document.

Primary Examiner—Nimeshkumar Patel
Assistant Examiner—Mack Haynes
Attorney, Agent, or Firm—Merchant, Gould, Smith, Edell, Welter & Schmidt

[57] ABSTRACT

An electroluminescent device includes first and second layers (6, 12) of light emitting semiconductive conjugated polymers with an electrode arrangement (4, 8, 10, 14) for injecting charge carriers into both light emissive layers to cause light to be emitted therefrom. The first and second light emitting layers are in viewing overlap, and the electrode arrangement includes two sets of electrodes (4, 8, 10, 12) which can be operated independently. The first light emissive layer is arranged to emit radiation of a first wavelength when excited and the second light emissive layer is arranged to emit radiation of a second wavelength when excited. The electroluminescent device can thus be operated to cause either radiation of the first wavelength or radiation of the second wavelength or both to be emitted and viewed.

28 Claims, 2 Drawing Sheets

ELECTROLUMINESCENT DEVICES HAVING A LIGHT-EMITTING LAYER

FIELD OF THE INVENTION

The present invention relates to electroluminescent devices and in particular electroluminescent devices in which the light emitting layer is a semiconductive conjugated polymer.

BACKGROUND TO THE INVENTION

Electroluminescent devices using a layer of semiconductive conjugated polymer as the light emitting layer are described in the Applicant's earlier International Application Publication No. PCT/WO90/13148. In that application, an electroluminescent device and a method of making it are described in which a layer of semiconductive conjugated polymer is placed between first and second contact layers which serve to inject into the polymer layer charge carriers of opposite types when an electric field is applied between them. These charge carriers combine in the polymer layer to form charge carrier pairs which then decay radiatively. In the radiative decay, radiation lying in the visible range is emitted.

The Applicant's earlier International Application Publication No. PCT/WO92/03490 describes a way in which the semiconductive conjugated polymer layer can be "tuned" to provide radiation in a range of selected wavelengths. This is done by controlling the semiconductor bandgap of the semiconductive layer. Thus, it is known that light of different colours can be produced using different semiconductive polymer layers. One of the main polymers of interest is poly(p-phenylenevinylene) (PPV) which emits a green light when excited. Excitation is used herein to denote the injection of charge carriers of opposite types into the polymer layer. Another polymer, poly(methylethylhexyloxy-p-phenylenevinylene) (MEH-PPV) emits a red-orange light. Furthermore, the Applicant's earlier British Patent Application No. 9226475.3 describes a class of conjugated polymers capable of emitting blue light.

Reference is also made to our earlier British Application No. 9311992.3 (Page White & Farrer Ref. 73745) which defines a class of nitrile substituted conjugated polymers suitable for use in electroluminescent devices.

The contents of the above-referenced Applications are incorporated herein by reference.

With the devices described in the above-referenced Applications, the colour of the emitted radiation is more or less fixed and is dependent on the choice of semiconductive conjugated polymer in the device. Once the device has been fabricated the colour of emitted radiation is either fixed or is subject to a slight variation if the operating characteristics of the device can be controlled to vary the brightness of the device. Any colour variation associated with a variation in brightness is however small and, being coupled to a variation in brightness, is not independent. Thus, there has not hithertofore been available an electroluminescent device using semiconductive conjugated polymers in which the colour of the emitted light can be controlled after fabrication of the device.

In the electroluminescent devices described in the above-referenced Applications, there is a single pair of contact layers arranged on either side of the polymer layer and which cooperate to inject charge carriers of opposite types into the polymer layer of the device. The polymer layer is sometimes referred to herein as the "active layer". The active layer of the device may be one substance or a plurality of different substances but is nevertheless subject to the electric field applied across the contact layers to cause the charge carriers to be injected into the active layer.

SUMMARY OF THE INVENTION

According to the present invention there is provided an electroluminescent device comprising: a first emitter comprising a layer of a polymer selected so that radiation of a first wavelength is emitted when charge carriers of opposite types are injected into the first emitter; first electrode means arranged to inject charge carriers into said first emitter; a second emitter comprising a layer of a polymer arranged in viewing overlap with said first emitter and selected so that radiation of a second wavelength is emitted when charge carriers of opposite types are injected into the second emitter; second electrode means arranged to inject charge carriers into said second emitter, said second electrode means being operable independently of said first electrode means whereby either radiation of said first wavelength or radiation of said second wavelength or both can be caused to be emitted and viewed.

The emitter can be any suitable light emitting layer, in particular sublimed molecular layers or semiconductive conjugated polymers. Suitable semiconductive conjugated polymers are discussed in the above-referenced Applications. The emitter can comprise more than one layer, for example PPV and nitrile PPV as discussed in BPA No. 9311992.3. Reference is also made to EPA No. 91301416.3 which describes the use of an emitter using PPV and a sublimed molecular layer.

Thus, in the present invention two independently operable electroluminescent structures are provided one on top of the other. The device is such that either the first emitter can be activated to produce radiation of a first colour, or the second emitter can be activated to produce radiation of a second colour or the first and second emitters can be activated together to produce a colour resulting from the combined radiation from the first and second emitters.

The present inventors have realised that it is possible to fabricate one electroluminescent device on top of another without disrupting the device (or devices) below, and to arrange that light from each of the devices can be viewed through the devices which might lie between the activated device and the glass substrate. It is surprising that a structure of this type can be made without disruption of the normal operation of the devices.

A third emitter including a layer of polymer can be provided in association with third electrode means to provide three independently operable structures within the device. Where the polymer emitters are chosen to emit light respectively of blue, green and red this would enable white light to be emitted and the control of individual layers would enable the full range of colours to be emitted.

The first electrode means can include first and second contact layers arranged on either side of the first emitter and connected to a source for applying an electric field between the first and second contact layers. Similarly, the second electrode means can comprise third and fourth contact layers on either side of the second emitter and connected to a source for applying an electric field between the third and fourth contact layers. In this case, the second and third contact layers will lie adjacent one another and may be materials of a different type. These should of course be transparent or at least semi-transparent.

Alternatively, the first electrode means can share a contact layer with the second electrode means so that the second and third contact layers are replaced by a single layer which can be connected so that it can either be operated with the first contact layer to provide an electric field across the first emitter or with the fourth contact layer to provide an electric field across the second semiconductive emitter, or with both. Once again, the single layer should be transparent or semi-transparent.

It will readily be appreciated that either the first or the fourth contact layer should also be transparent or semi-transparent to enable radiation from the device to be viewed.

The present invention also provides a method of making an electroluminescent device comprising the steps of: providing a first electrode; depositing on top of said first electrode a first emitter comprising a layer of a polymer selected so that radiation of a first wavelength is emitted when charge carriers of opposite types are injected into the first emitter; providing on top of said first emitter a second electrode; depositing on top of said second electrode a second emitter comprising a layer of a polymer selected so that radiation of a second wavelength is emitted when charge carriers of opposite types are injected into the second emitter; providing on top of said second emitter a third electrode; connecting the first and second electrodes to a first source for applying an electric field across the first emitter; and connecting the second and third electrodes to a second source for applying an electric field across the second emitter, the first and second source for applying electric fields being operable independently one from another whereby either radiation of said first wavelength or radiation of said second wavelength or both can be caused to be emitted and viewed.

The second electrode can be a single layer capable of operating with either the first or third electrode or it can comprise two layers, one intended to operate with the first electrode and one with the third electrode. In the latter case, the second electrode can comprise calcium and gold layers put down by thermal evaporation. This is an unexpectedly stable and conducting combination and is also semi-transparent. The inventors have found that it is possible to fabricate extra layers on top of the layers first put down without damage to the layers first put down. This is unexpected and surprising, since normally damage to the lower layers would have been expected.

Each emitter can comprise a sublimed organic molecular film or a single semiconductive conjugated polymer layer or a plurality of semiconductive conjugated polymer layers or a combination of layers of sublimed organic molecular film and a semiconductive conjugated polymer. As an example, the first emitter can comprise a single layer of PPV and the second emitter can comprise a single layer of MEH-PPV. As an alternative, one of the first or second emitters could comprise a plurality of nitrile-PPV polymer layers as described in our earlier British Patent Application No. 9311992.3 (Page White & Farrer Ref. 73745) referred to above.

For a better understanding of the present invention and to show how the same may be carried into effect reference will now be made by way of example to the accompanying drawings.

DESCRIPTION OF THE PREFERRED EMBODIMENTS

Structure

Figure 1:
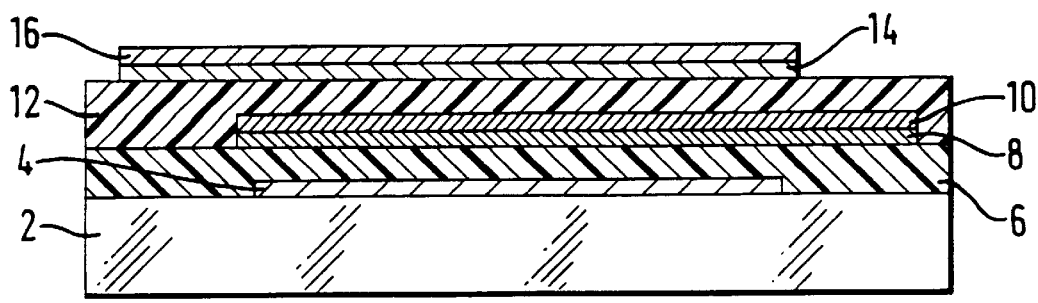
FIG. 1 is a diagrammatic illustration of a device in accordance with a first embodiment of the invention.

FIG. 1 shows an electroluminescent device having two active semiconductive layers. The device comprises a glass substrate 2 on which has been deposited a coating of semi-transparent indium tin oxide (ITO). As will become clearer in the following, this coating of indium tin oxide is etched to leave a layer 4 over an area defining the active light emitting area of the device. A first layer 6 of semiconductive conjugated polymer in the form of PPV is put down onto the glass substrate 2 and indium tin oxide 4. A first contact layer 8 of calcium is provided on the layer 6 of PPV, this layer 8 being put down in the form of a strip which extends across the active area defined by the indium tin oxide layer 4. The layer 4 of indium tin oxide and the layer 8 of calcium constitute the first and second contact layers for the first layer 6 of PPV.

On top of the layer 8 of calcium there is formed a strip 10 of gold in overlap with the strip of calcium. A second layer 12 of semiconductive conjugated polymer is put down, this time of MEH-PPV. The structure and deposition properties of this polymer are known from the earlier above-referenced Applications. This provides a second active polymer layer for the device. A second layer 14 of calcium is then put down in the form of a strip on top of the layer of MEH-PPV. The layer 14 of calcium and the layer 10 of gold constitute contact layers for the second polymer layer 12. The layer 14 of calcium is put down as a strip which extends across the active area defined by the layer 4 of indium tin oxide. The layers 8 and 10 extend across the active area by a large extension to the right in FIG. 1 and a smaller extension to the left in FIG. 1. The calcium layer 14 extends across the active area by a large extension to the left in FIG. 1 and a smaller extension to the right. This can readily be seen from FIG. 1 and is explained in more detail with reference to FIG. 3. Finally, the layer 14 of calcium is capped with a layer 16 of aluminium to reduce the contamination sensitivity of the device.

Figure 3:
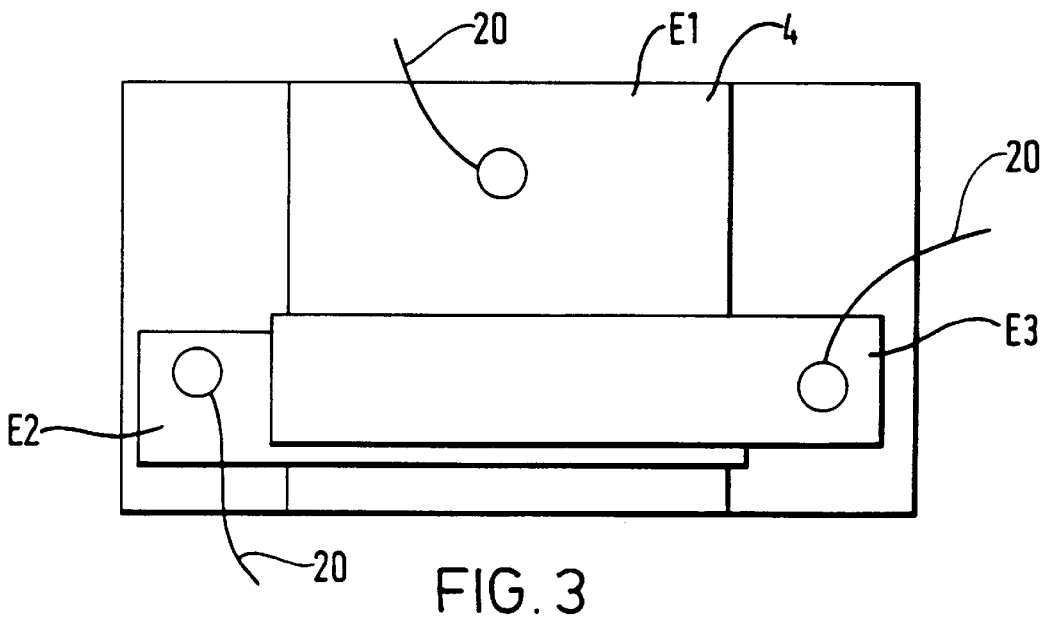
FIG. 3 is a view from the top of a device showing the electrode structure of FIG. 1.

The structure of the device is illustrated further in FIG. 3. In FIG. 3, the active area covered by the indium tin oxide is denoted by reference numeral 4 and is shown as approximately square. The ITO constitutes a first electrode E1. The layers 8 and 10 of calcium and gold are formed as strips overlapping each other and are referred to in the following as the second electrode denoted E2 in FIG. 3. As can readily be seen from FIG. 3, the electrode E2 is a strip which extends across the indium tin oxide layer and beyond it to the left in FIG. 3. The layers 14 and 16 are formed as strips overlapping each other and are referred to herein as the third electrode denoted E3 in FIG. 3. The strip electrode E3 extends across the indium tin oxide area 4 and beyond it to the right in FIG. 3. The second and third electrodes E2 and E3 should as far as possible be formed in direct overlap one with another, although they are shown slightly displaced in FIG. 3, this displacement possibly arising from manufacturing tolerances in the masks used to produce the strips, as described later.

With this structure, it is possible to contact the electrodes E1, E2 and E3 simply by gluing thin wires with silver dag (electrically conducting paint containing colloidal silver) to them, as denoted by reference numerals 20. This is possible as there is no overlap of the different electrodes other than in the active area which is now the area defined by overlap of the indium tin oxide electrode E1, strips defining electrode E2 and strips defining electrode E3.

As can be seen from FIG. 3, the strips defining electrodes E2 and E3 extend beyond the area defined by the indium tin oxide layer 4 not only in the direction in which a contact is applied but also by a smaller amount in the other direction. This has been found by the inventors to be important in avoiding breakdown of the device due to the high electric fields applied.

Method of Manufacture

There follows a description of the method by which the device illustrated in FIGS. 1 and 3 can be formed.

The glass substrate 2 is commercially supplied glass which has been coated with a layer of indium tin oxide. The area covered by indium tin oxide is defined by etching of strips at opposite edges of the substrate to leave the square area 4 illustrated in FIG. 3. After thorough cleaning of the thus prepared substrate with indium tin oxide on it, a precursor to PPV was spun onto it. Spinning conditions were similar to those described in our above-referenced Applications for the preparation of electroluminescent devices described therein. The precursor was fully converted by heating to 220° C. overnight. The contact layer 8 of calcium was evaporated on top of the layer 6 of PPV through a mask defining a strip. The contact layer 8 of calcium acts an electron injector for the layer 6 of PPV. As will be appreciated, the indium tin oxide layer 4 acts as the hole injector for the layer 6 of PPV. Gold was evaporated directly on top of the layer 8 of calcium through the same mask to form the strip 10. Due to its high work function, the gold layer 10 acts as a hole injector for the layer 12. The gold also serves to protect the layer of calcium.

After evaporating the calcium and gold strips 8,10, MEH-PPV was spun at 2000 rpm on top of the structure. Dry chloroform was used to dissolve the solid precursor and the solution was never exposed to air. The inventors have found that the thickness of the layer 12 of MEH-PPV is an important parameter. For the device described herein, a solution which resulted in films of an optical density of 1.3 at 500 nm when spun at 2000 rpm was used. After spinning this second polymer layer 12, the structure was annealed at 180° C. under vacuum for several hours to reduce surface contamination further. The mask which was used to evaporate the layers 8 and 10 is then displaced with respect to the original position (to the left in FIG. 3) and is used to evaporate the further layer 14 of calcium which acts as the electron injecting layer for the second polymer layer 12. Finally, aluminium is evaporated through the same mask in overlap with the layer 14 of calcium to form the layer 16.

Finally, the connections are made to the individual electrodes by gluing thin wires with silver dag to them.

Operation of the Device

The device can be operated in one of the following modes. In all of these modes, the electrode E2 was connected to ground and the positive/negative voltages were applied to the electrode E1 and/or the electrode E2 according to the mode of operation as described below.

Separate Operation

The active layers 6 and 12 can be operated independently so that emission of only one of the characteristic colours can be observed. Maximum operating voltages of a device which has been constructed according to the above described method are typically 15V applied across the layer 6 of PPV to give green emitted light and 35V across the second active layer 12 of MEH-PPV to give orange-red light. In this mode, the device can be switched between the emitted colours. The drive voltages are primarily determined by the thicknesses of the layers and can be adjusted by varying these thicknesses. The drive voltages have been found to be similar to the single layer devices discussed in PCT/WO90/13148.

As will be readily appreciated by readers familiar with the disclosures of the above-referenced applications referred to above and incorporated herein by reference, light is caused to be emitted from the active polymer layers 6 and 12 by the injection therein of charge carriers of opposite types. For the layer 6, a positive voltage is applied to the indium tin oxide layer 4 relative to the calcium layer 8 so that holes are injected from the indium tin oxide layer and electrons are injected from the calcium. These holes and electrons combine in the layer 6 and then decay radiatively to emit light which, for PPV, is green. For the layer 12, the layer 14 of calcium is rendered negative relative to the layer 10 of gold so that holes are injected from the gold layer 10 and electrons are injected from the calcium layer 14. These holes and electrons combine in the layer 12 to form charge carrier layers which decay to emit radiation which, for MEH-PPV, is orange-red.

Combined Operation

By causing electric fields to be applied across both the active layers 6,12 simultaneously, it is possible to cause both layers to emit radiation together to give a mixed colour, yellow for the described example. Where both layers 6 and 12 are rendered active simultaneously, the voltages applied must be lower than the maximum voltages referred to above for single operation, otherwise breakdown of one or both of the layers might be expected.

The concept of the invention can be utilised to provide a further layer of semiconductive conjugated polymer on top of the calcium layer 14 with a further contact layer on top of that. Where the third polymer layer is capable of emitting blue light as described in our Application No. 9226475.3, white light may be produced with the full range of colours.

Where three layers of polymer are used, the preferred arrangement of the layers is to have the blue emitting layer adjacent the glass substrate and indium tin oxide layer, the green emitting layer next and finally the red emitting layer. This prevents absorption of light from one device by the polymer layer in the next device. The light emission is of course viewed through the glass substrate 2.

It will readily be appreciated that while a particular example is given, the materials used for the polymer layers and contacts can be widely varied, and in particular reference is made to the above-referenced earlier Applications which describe different possibilities for the polymer layers.

Likewise, the electrode E2 (formed herein by the layer 8 of calcium and the layer 10 of gold) can be formed of any suitable materials. It must of course be at least semi-transparent and this is achieved in the present example by maintaining the total thickness of the metals calcium and gold below a thickness of a few hundred angstroms.

Figure 2:
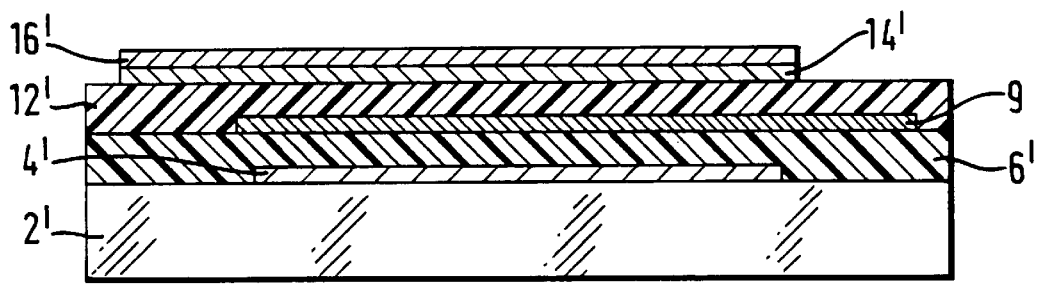
FIG. 2 is a diagrammatic representation of a device according to a second embodiment of the present invention.

FIG. 2 illustrates a further specific possibility for a device in which the electrode E2 is formed as a single layer. In FIG. 2, reference numeral 2' denotes a glass substrate, reference numeral 4' denotes an area of indium tin oxide and reference numeral 6' denotes an area of PPV. This is as described above with reference to FIG. 1. However, in contrast to FIG. 1, layers 8 and 10 are replaced by a single layer 9 of an electron injector. There is then formed a layer 12' corresponding to the layer 12 in FIG. 1 on top of which is placed a layer 14' of a hole injector in place of the layer 14 of calcium. A layer of aluminium 16' covers the layer 14' of hole injector. In this device, the layer 9 acts as an electron injector for either the layer 6 in association with the indium tin oxide layer 4' or the layer 12' in association with the hole injecting layer 14'. When both combinations are activated, the devices operate back to back.

In the embodiment of FIG. 2, the layer 9 of electron injector can be a semi-transparent film of calcium, aluminium, indium or other low work function conducting materials.

As an alternative to the construction of FIG. 2, the outer layers 4' and 14' can be selected to allow electron injection. The layer 4' would then be semi-transparent and would need to be either a thin layer of calcium, aluminium, indium or other low work function conducting materials or could be constituted by a double layer, such as a thin layer of a low work function metal formed on top of ITO. In this case, the layer 9 would act as a hole injector and would be chosen to have a high work function. It could be selected from thin films of metals such as gold, indium tin oxide or highly conducting polymers such as polyaniline or multiple layers formed from these materials.

Figure 4A:
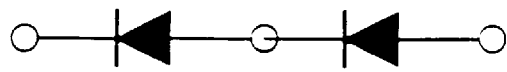
FIGS. 4a, 4b, 5a, 5b, 5c and 5d are diagrams illustrating the electrical connection of the devices.
Figure 4B:
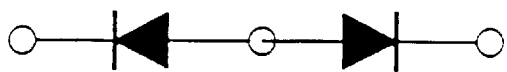

FIGS. 4a and 4b are diagrams illustrating how the individual electroluminescent devices are connected in the structures of FIG. 1 and FIG. 2 respectively. In FIG. 1, the electroluminescent devices can be considered as two diodes in series whereas in FIG. 2 the electroluminescent devices can be considered as two diodes in back-to-back connection.

Figure 5A:
Figure 5B:
Figure 5C:
Figure 5D:

The invention contemplates the addition of a third layer of a light emissive polymer capable of emitting radiation at a wavelength different from the first and second layers of polymer. This third layer would be put down on top of the layer 16 in FIG. 1 (or 16' in FIG. 2) and a further electrode is then placed on top of it. This electrode is referred to in the following by the reference numeral E4. In that case, layers 14 and 16 (in FIG. 1) or 14' and 16' (in FIG. 2) could be a composite, providing electron injection to one side and hole injection to the other or could be a single layer providing electron injection or hole injection to both sides. FIGS. 5a to 5d illustrate the different possibilities for connections of the electroluminescent devices in a three layer structure. In FIG. 5a, the devices are shown as three diodes connected in series. In FIG. 5b, two devices are connected as diodes in a back-to-back configuration, with the middle device being arranged in front-to-front connection with the last device. In FIG. 5c, the first two devices are shown connected in series with the last device in back-to-back arrangement with the middle device. In FIG. 5d, the first two devices are shown connected in back-to-back arrangement, with the last device being in series with the middle device.

As an alternative to the above examples, the light emitters could be constructed using sublimed organic molecular films. In one embodiment, an emitter could use a layer of PPV and a sublimed molecular layer as discussed in EPA 91301416.3. In using sublimed molecular films, care must be taken that subsequent layers can be properly processed. For example, thermal conversion of PPV from its precursor polymer to high temperature might damage a layer of sublimed molecular film below it.

We claim:
1. An electroluminescent device comprising:
   a first emitter comprising an organic layer selected so that radiation of a first wavelength is emitted when charge carriers of opposite types are injected into the first emitter;
   first electrode means arranged to inject charge carriers into said first emitter, said first electrode means including first and second contact layers of different types arranged on either side of the first emitter and connected to a source for applying an electric field between the first and second contact layers so that charge carriers of respective first and second types are injected into the first emitter;
   a second emitter comprising an organic layer arranged in viewing overlap with said first emitter and selected so that radiation of a second wavelength is emitted when charge carriers of opposite types are injected into the second emitter; and
   second electrode means arranged to inject charge carriers into said second emitter, said second electrode means being operable independently of said first electrode means whereby either radiation of said first wavelength or radiation of said second wavelength or both can be caused to be emitted and viewed.
2. An electroluminescent device according to claim 1, wherein the second electrode means comprises third and fourth contact layers on either side of the second emitter and connected to a second source for applying an electric field between the third and fourth contact layers.
3. An electroluminescent device according to claim 1, wherein the second electrode means includes said second contact layer and a third contact layer lying on the other side of the second emitter, said second and third contact layers being connected to a second source for applying an electric field across the second emitter.
4. An electroluminescent device according to claim 1, wherein the first contact layer comprises indium tin oxide and the second contact layer comprises calcium.
5. An electroluminescent device according to claim 2 wherein the third contact layer comprises gold and the fourth contact layer comprises calcium.
6. An electroluminescent device according to claim 5 wherein the fourth contact layer of calcium is provided with a capping layer.
7. An electroluminescent device according to claim 6 wherein the capping layer comprises aluminium.
8. An electroluminescent device according to claim 4 wherein the third contact layer comprises gold and the fourth contact layer comprises calcium.
9. An electroluminescent device according to claim 8 wherein the fourth contact layer of calcium is provided with a capping layer.
10. An electroluminescent device according to claim 9 wherein the capping layer comprises aluminium.
11. An electroluminescent device according to claim 2 wherein the combined thickness of the second and third contact layers is of the order of a few hundred angstroms.
12. An electroluminescent device according to claim 5 wherein the combined thickness of the second and third contact layers is of the order of a few hundred angstroms.
13. An electroluminescent device according to claim 1 wherein at least one of the first emitter and the second emitter comprise at least one sublimed organic molecular layer.
14. An electroluminescent device according claim 1 wherein at least one of the first emitter and the second emitter comprise at least one semiconductive conjugated polymer layer.

15. An electroluminescent device according to claim 1 wherein at least one of the first emitter and the second emitter each comprise a plurality of semiconductive conjugated polymer layers.

16. An electroluminescent device according to claim 1 wherein the first emitter comprises a layer of PPV.

17. An electroluminescent device according to claim 1 wherein the second emitter comprises a layer of MEH-PPV.

18. An electroluminescent device according to claim 14 wherein each layer of semiconductive conjugated polymer has a semiconductive bandgap selected so that radiation of a predetermined wavelength is emitted.

19. An electroluminescent device according to claim 15 wherein each layer of semiconductive conjugated polymer has a semiconductive bandgap selected so that radiation of a predetermined wavelength is emitted.

20. An electroluminescent device according to claim 16 wherein each layer of semiconductive conjugated polymer has a semiconductive bandgap selected so that radiation of a predetermined wavelength is emitted.

21. An electroluminescent device according to claim 17 wherein each layer of semiconductive conjugated polymer has a semiconductive bandgap selected so that radiation of a predetermined wavelength is emitted.

22. A method of making an electroluminescent device comprising the steps of:

providing on a substrate a first electrode for injecting charge carriers of a first type;

depositing on top of said first electrode a first emitter comprising an organic layer selected so that radiation of a first wavelength is emitted when charge carriers of opposite types are injected into the first emitter;

providing on top of said first emitter a second electrode for injecting charge carriers of a second type;

depositing on top of said second electrode a second emitter comprising an organic layer selected so that radiation of a second wavelength is emitted when charge carriers of opposite types are injected into the second emitter;

providing on top of said second emitter a third electrode for injecting charge carriers of said first type;

connecting the first and second electrodes to a first source for applying an electric field across the first emitter so that charge carriers of the first and second types are injected into the first emitter; and connecting the second and third electrodes to a second source for applying an electric field across the second emitter so that charge carriers of the first and second types are injected into the second emitter, the first and second source for applying electric fields being operable independently one from another whereby either radiation of said first wavelength or radiation of said second wavelength or both can be caused to be emitted and viewed.

23. A method according to claim 22 wherein the step of providing a first electrode comprises coating a glass substrate with indium tin oxide and etching the indium tin oxide to define an active area of the device.

24. A method according to claim 22 wherein the step of providing a second electrode comprises depositing a semi-transparent metallic layer having a thickness of the order of a few hundred angstroms in the form of a strip overlapping the first electrode.

25. A method according to claim 22 wherein the step of providing a third electrode comprises depositing a metallic layer in the form of a strip in partial overlap with the second electrode.

26. A method according to claim 22 wherein at least one of the first emitter and the second emitter comprise a layer of a semiconductive conjugated polymer.

27. A method according to claim 22 wherein at least one of the first emitter and the second emitter comprise a layer of sublimed organic molecular film.

28. An electroluminescent device comprising:

a first emitter comprising an organic layer selected so that radiation of a first wavelength is emitted when charge carriers of opposite types are injected into the first emitter;

first electrode means arranged to inject charge carriers into said first emitter, said first electrode means including first and second contact layers of different types arranged on either side of the first emitter and connected to a source for applying an electric field between the first and second contact layers so that charge carriers of respective first and second types are injected into the first emitter, the second contract layer comprising a semi-transparent metallic layer having a thickness of the order of a few hundred angstroms;

a second emitter comprising an organic layer arranged in viewing overlap with said first emitter and selected so that radiation of a second wavelength is emitted when charge carriers of opposite types are injected into the second emitter; and second electrode means arranged to inject charge carriers into said second emitter, said second electrode means being operable independently of said first electrode means whereby either radiation of said first wavelength or radiation of said second wavelength or both can be caused to be emitted and viewed.

* * * * *